United States Patent
Hsieh et al.

(10) Patent No.: US 6,876,005 B2
(45) Date of Patent: Apr. 5, 2005

(54) LIGHT EMITTING DIODE HAVING AN ADHESIVE LAYER

(75) Inventors: Min-Hsun Hsieh, Hsin-Chu (TW); Tzu-Feng Tseng, Hsin-Chu (TW); Wen-Huang Liu, Hsin-Chu (TW); Ting-Wei Yeh, Hsin-Chu (TW); Jen-Shui Wang, Hsin-Chu (TW)

(73) Assignee: Epistar Corporation, Hsin-Chu (TW)

( * ) Notice: Subject to any disclaimer, the term of this patent is extended or adjusted under 35 U.S.C. 154(b) by 0 days.

(21) Appl. No.: 10/604,352

(22) Filed: Jul. 14, 2003

(65) Prior Publication Data

US 2004/0106225 A1 Jun. 3, 2004

(30) Foreign Application Priority Data

Jul. 15, 2002 (TW) ........................................ 91114587 A

(51) Int. Cl.[7] .............................................. H01L 31/12
(52) U.S. Cl. .......................................... 257/84; 257/96
(58) Field of Search ................................ 257/84, 96–97

(56) References Cited

U.S. PATENT DOCUMENTS

| | | | | |
|---|---|---|---|---|
| 6,420,736 B1 | * | 7/2002 | Chen et al. | 257/99 |
| 6,563,139 B2 | * | 5/2003 | Hen | 257/89 |
| 6,576,933 B2 | * | 6/2003 | Sugawara et al. | 257/103 |
| 6,583,443 B1 | * | 6/2003 | Chang et al. | 257/79 |

* cited by examiner

Primary Examiner—Allan R. Wilson
(74) Attorney, Agent, or Firm—Winston Hsu

(57) ABSTRACT

A method for forming a light emitting diode includes forming a first stack, forming a second reaction layer over the first stack, forming a second stack, forming a first reaction layer over the second stack, and holding together the first reaction layer and the second reaction layer by means of a transparent adhesive layer. The transparent adhesive layer is formed between the first and second reaction layer, therefore the second reaction layer of the first stack will not come off the first reaction layer of the second stack.

9 Claims, 5 Drawing Sheets

LIGHT EMITTING DIODE HAVING AN ADHESIVE LAYER

BACKGROUND OF INVENTION

1. Field of the Invention

The present invention relates to a light emitting diode, and more particularly, a light emitting diode having an adhesive layer to strengthen the structure of the light emitting diode.

2. Description of the Prior Art

Light emitting diodes are widely used in optical displays, laser diodes, traffic lights, data storage devices, communications devices, illumination equipments, and medical equipments. Therefore, enhancing the performance of the light emitting diodes is an important issue in the field of LEDs.

Related art teaches a light emitting diode and its manufacturing method in which the light emitting diode is formed by adhering a transparent insulating adhesive layer to an emitting stack and a transparent substrate. The adherence is achieved by Van der Waals forces. However the Van der Waals forces are too weak to hold the emitting stack and the transparent substrate in place. Therefore the emitting stack may come off the transparent substrate easily.

SUMMARY OF INVENTION

It is therefore an object of the claimed invention to develop a light emitting diode with a strong structure to solve the aforementioned problem.

According to the first claimed invention, the method for forming a light emitting diode comprises forming a first stack, forming a second stack, forming a second reaction layer over said first stack, forming a first reaction layer over said second stack, and holding together said first reaction layer and said second reaction layer by means of a transparent adhesive layer.

According to the second claimed invention, the light emitting diode comprises a first stack, a second reaction layer formed on the first stack, a second stack, a first reaction layer formed on the second stack, a transparent adhesive layer formed between the first and second reaction layers, and first and second electrodes formed on the first stack.

These and other objects of the claimed invention will no doubt become obvious to those of ordinary skill in the art after reading the following detailed description of the preferred embodiment that is illustrated in the various figures and drawings.

DETAILED DESCRIPTION

Figure 1:
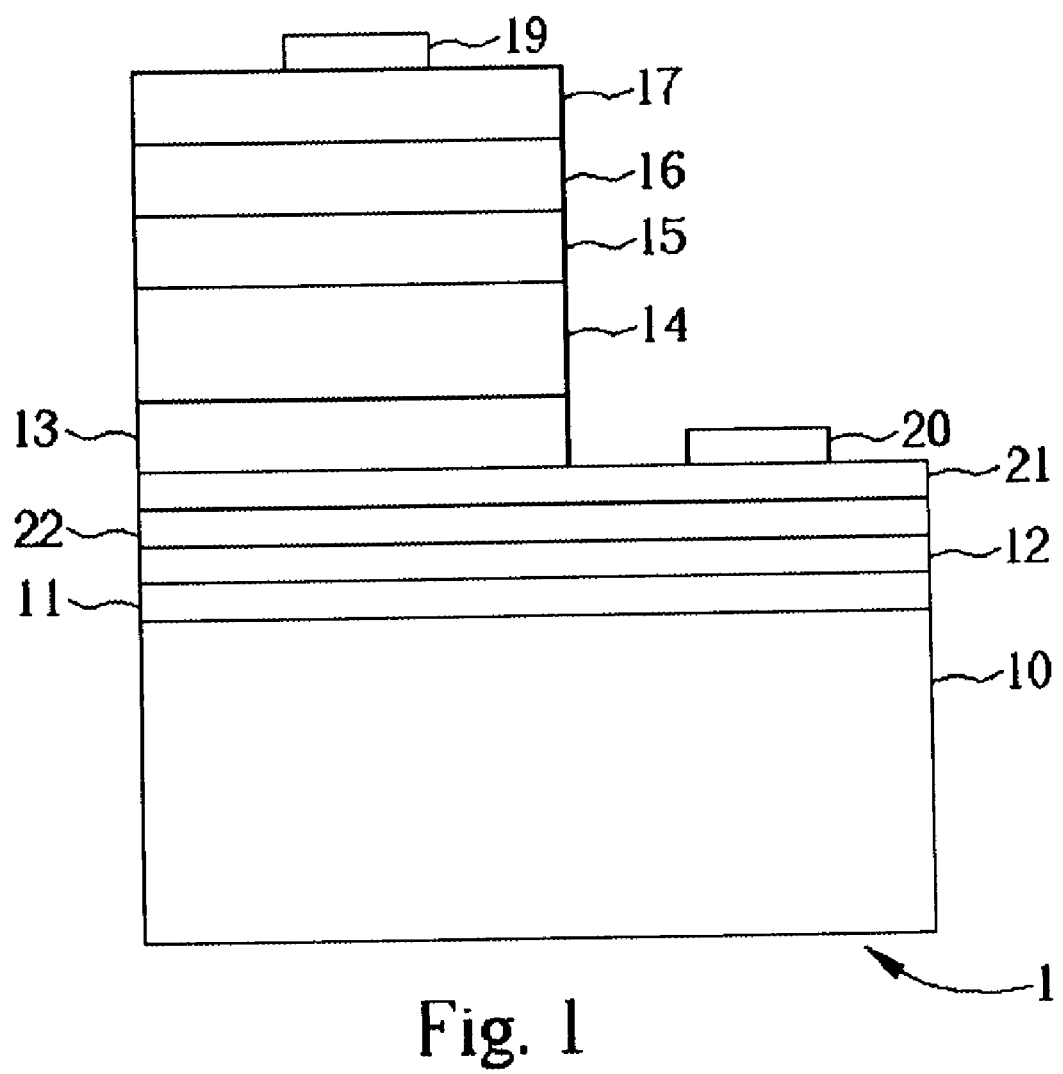
FIG. 1 is a perspective view of a light emitting diode according to the present invention.

Please refer to FIG. 1. FIG. 1 is a perspective view of a light emitting diode 1 according to the present invention. The light emitting diode 1 comprises a second substrate 10, a first reaction layer 11 formed on the second substrate 10, a transparent adhesive layer 12 formed on the first reaction layer 11, a second reaction layer 22 formed on the transparent adhesive layer 12, and a transparent conductive layer 21 formed on the second reaction layer 22. The transparent conductive layer 21 has a first surface area and a second surface area. The light emitting diode 1 further comprises a first contact layer 13 formed on the first surface area of the transparent conductive layer 21, a first cladding layer 14 formed on the first contact layer 13, an emitting layer 15 formed on the first cladding layer 14, a second cladding layer 16 formed on the emitting layer 15, a second contact layer 17 formed on the second cladding layer 16, a first electrode 19 formed on the second contact layer 17 and a second electrode 20 formed on the second surface area of the transparent conductive layer 21.

Figure 2:
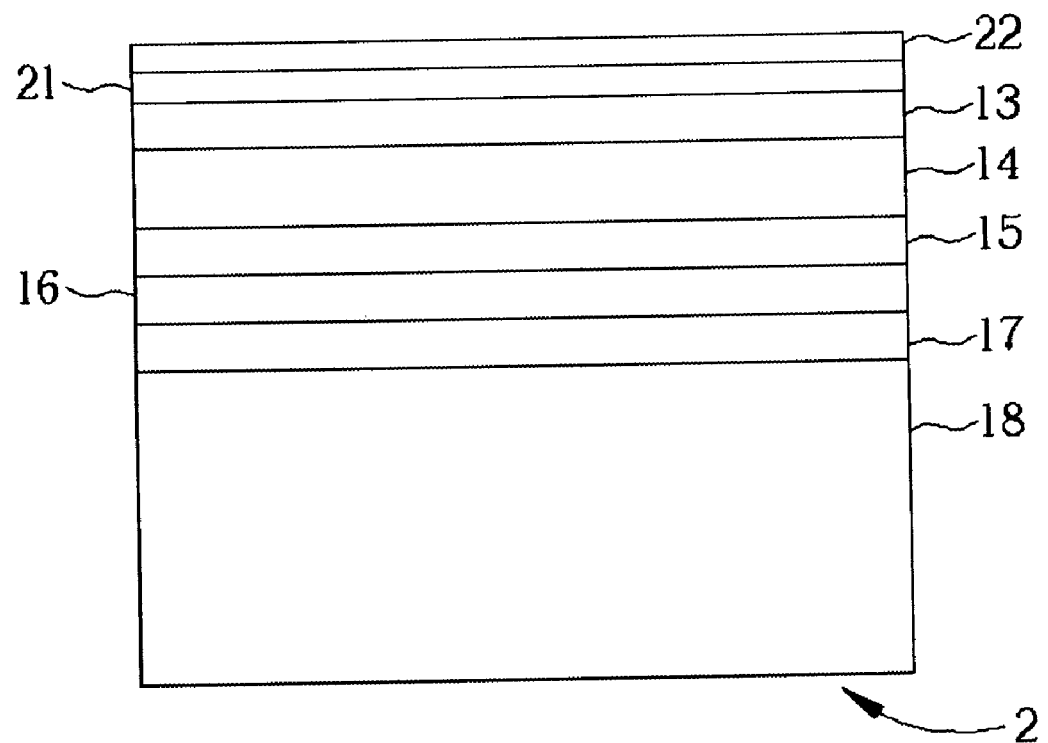
FIG. 2 is a perspective view of a first stack according to the present invention.

Please refer to FIG. 2. FIG. 2 is a perspective view of a first stack 2 and the second reaction layer 22 according to the present invention. The first stack 2 and the second reaction layer 22 are formed in the following sequence: forming a first substrate 18, forming the second contact layer 17 on the first substrate 18, forming the second cladding layer 16 on the second contact layer 17, forming the emitting layer 15 on the second cladding layer 16, forming the first cladding layer 14 on the emitting layer 15, forming the first contact layer 13 on the first cladding layer 14, forming the transparent conductive layer 21 on the first contact layer 13, and forming the second reaction layer 22 on the transparent conductive layer 21.

Figure 3:
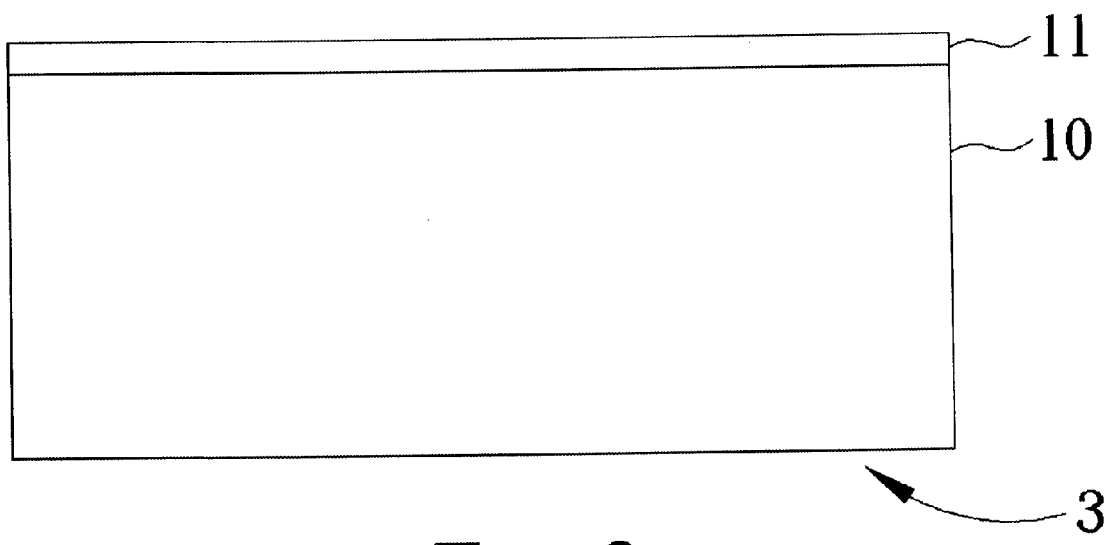
FIG. 3 is a perspective view of a second stack according to the present invention.
Figure 4:
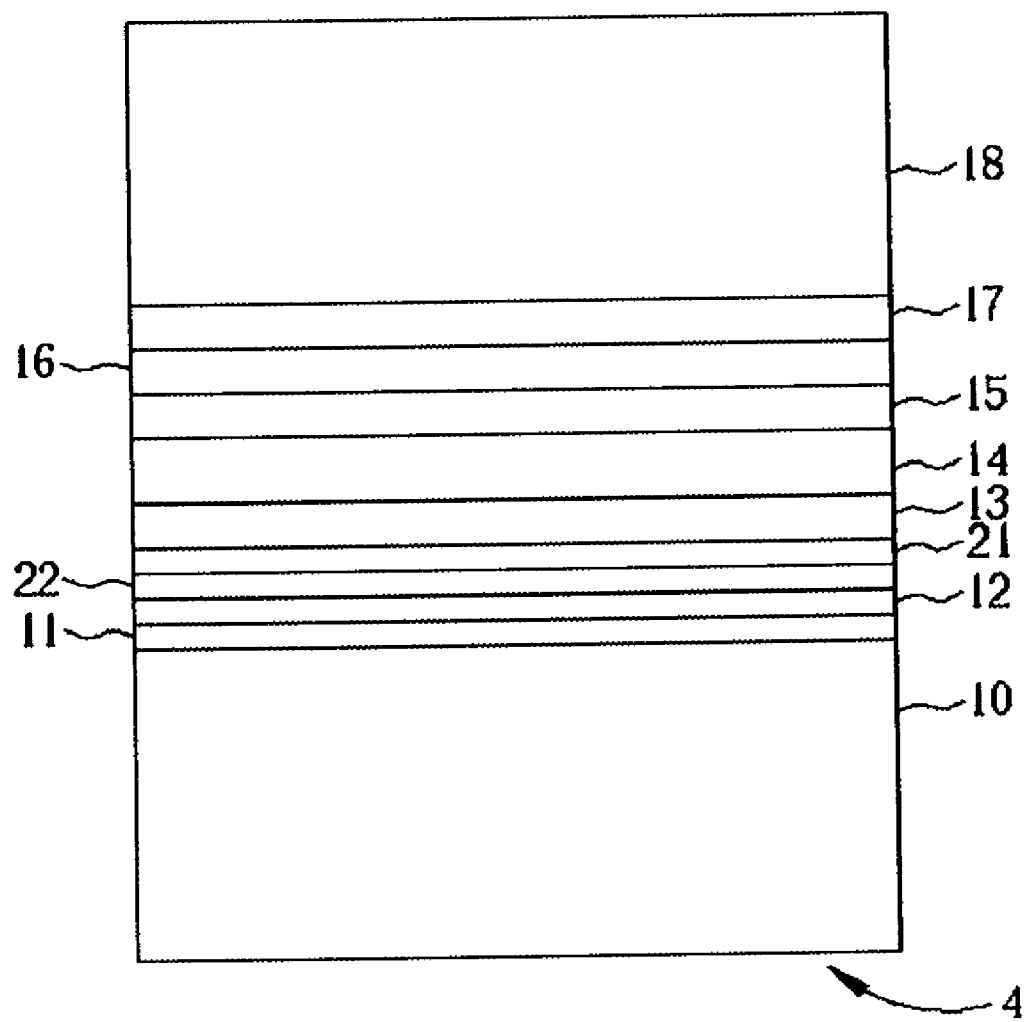
FIG. 4 is a perspective view of a third stack according to the present invention.
Figure 5:
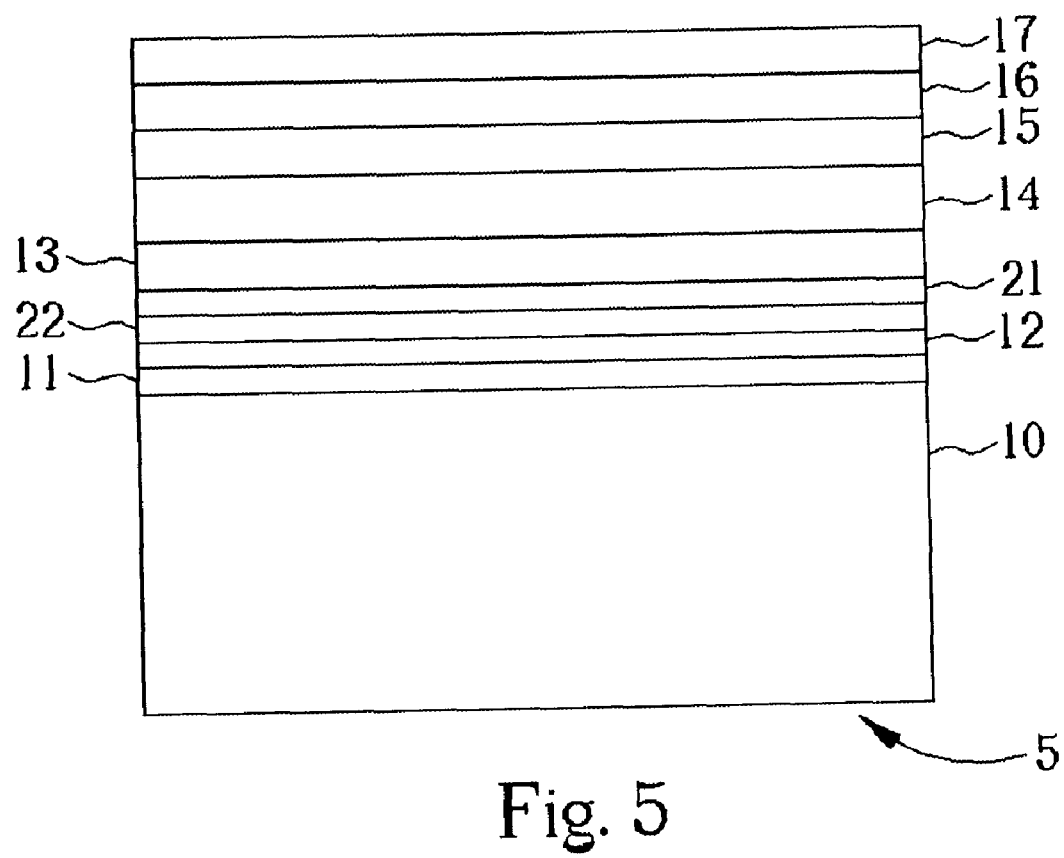
FIG. 5 is a perspective view of a fourth stack according to the present invention.

Please refer to FIGS. 3 to 5. FIG. 3 is a perspective view of a second stack 3 and the first reaction layer 11 according to the present invention. FIG. 4 is a perspective view of a third stack 4 according to the present invention. FIG. 5 is a perspective view of a fourth stack 5 according to the present invention. The second stack 3 and the first reaction layer 11 are formed by forming the second substrate 10, and forming the first reaction layer 11 on the second substrate 10. The third stack 4 is formed by performing a chemical reaction to generate a hydrogen bond or an ionic bond between the second reaction layer 22 of the first stack 2 and the transparent adhesive layer 12, and to generate a hydrogen bond or an ionic bond between the first reaction layer 11 of the second stack 3 and the transparent adhesive layer 12. The chemical reaction is performed with an increased temperature and may additionally with an increased pressure. The fourth stack 5 is formed by removing the first substrate 18. After the fourth stack 5 is formed, the fourth stack 5 is etched to the second surface area of the transparent conductive layer 21. Then the first electrode 19 is formed on the second contact layer 17, and the second electrode 20 is formed on the second surface area of the transparent conductive layer 21 to form the light emitting diode 1.

The first substrate 18 comprises at least one material selected from a group consisting of GaP, GaAs, Ge, and the like materials. The second substrate 10 comprises at least one material selected from a group consisting of SiC, Al2O3, glass materials, quartz, GaP, GaAsP, AlGaAs, and the like materials. The transparent adhesive layer 12 comprises at least one material selected from a group consisting of PI, BCB, PFCB, and the like materials. The first reaction layer 11 and the second reaction layer 22 each comprise at least one material selected from a group consisting of SiNx, Ti, Cr, and other materials which will increase adhesion between the material of the first substrate 18 and the transparent adhesive layer 12 and between the second substrate 10 and the transparent adhesive layer 12 through either hydrogen bonding or ionic bonding. The first contact layer 13 and the second contact layer 17 each comprise at least one material selected from a group consisting of GaP, GaAs, GaAsP, InGaP, AlGaInP, AlGaAs, and the like materials. The first cladding layer 14, the emitting layer 15, and the second cladding layer 16 each comprise AlGaInP or the like materials. The transparent conductive layer 21 comprises at least one material selected from the group consisting of indium tin oxide, cadmium tin oxide, antimony tin oxide, zinc oxide, zinc tin oxide, BeAu, GeAu, Ni/Au, and the like materials.

Compared with related art, a chemical reaction is performed to generate a hydrogen bond or an ionic bond between the second reaction layer 22 and the transparent adhesive layer 12, and to generate a hydrogen bond or an ionic bond between the first reaction layer 11 and the transparent adhesive layer 12. The hydrogen bonds or ionic bonds can firmly hold the second reaction layer 22 above the first reaction layer 11. Therefore the second reaction layer 22 will not come off the first reaction layer 11. The light emitting diode 1 has a strong structure.

Those skilled in the art will readily observe that numerous modifications and alterations of the light emitting diode may be made while retaining the teachings of the invention. Accordingly, the above disclosure should be construed as limited only by the metes and bounds of the appended claims.

We claim:

1. A light emitting diode comprising:
    a first stack;
    a second reaction layer formed on the first stack;
    a second stack;
    a first reaction layer formed on the second stack;
    a transparent adhesive layer formed between the first and second reaction layers; and
    a first electrode and a second electrode formed on the first stack.

2. The light emitting diode of claim 1 wherein the first stack comprises:
    a transparent conductive layer formed on the second reaction layer, the transparent conductive layer having a first surface area and a second surface area;
    a first contact layer formed on the first surface area of the transparent conductive layer;
    a first cladding layer formed on the first contact layer;
    an emitting layer formed on the first cladding layer;
    a second cladding layer formed on the emitting layer; and
    a second contact layer formed on the second cladding layer;
    wherein the first electrode is formed on the second contact layer, and the second electrode is formed on the second surface area of the transparent conductive layer.

3. The light emitting diode of claim 2 wherein the first contact layer and the second contact layer each comprise at least one material selected from a group consisting of GaP, GaAs, GaAsP, InGaP, AlGaInP, and AlGaAs.

4. The light emitting diode of claim 2 wherein the first cladding layer, the emitting layer, and the second cladding layer each comprise AlGaInP.

5. The light emitting diode of claim 2 wherein the transparent conductive layer comprises at least one material selected from a group consisting of indium tin oxide, cadmium tin oxide, antimony tin oxide, zinc oxide, zinc tin oxide, BeAu, GeAu, and Ni/Au.

6. The light emitting diode of claim 1 wherein the first and second reaction layers each comprise at least one material selected from a group consisting of SiNx, Ti, and Cr.

7. The light emitting diode of claim 1 wherein the transparent adhesive layer comprises at least one material selected from a group consisting of PI, BCB, and PFCB.

8. The light emitting diode of claim 1 wherein the second stack comprises a second substrate, the first reaction layer being formed on the second substrate.

9. The light emitting diode of claim 8 wherein the second substrate comprises at least one material selected from a group consisting of SiC, Al2O3, glass materials quartz, GaP, GaAsP, and AlGaAs.

* * * * *